United States Patent
Chien et al.

(10) Patent No.: US 8,912,448 B2
(45) Date of Patent: Dec. 16, 2014

(54) STRESS RELIEF STRUCTURE

(71) Applicant: Industrial Technology Research Institute, Hsinchu (TW)

(72) Inventors: Jui-Hung Chien, New Taipei (TW); Chiao-Ling Lung, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 117 days.

(21) Appl. No.: 13/848,739

(22) Filed: Mar. 22, 2013

(65) Prior Publication Data
US 2014/0151090 A1    Jun. 5, 2014

(30) Foreign Application Priority Data
Nov. 30, 2012   (TW) .............................. 101145178 A

(51) Int. Cl.
*H05K 1/03* (2006.01)
*H05K 1/02* (2006.01)

(52) U.S. Cl.
CPC .................................. *H05K 1/0271* (2013.01)
USPC .......... 174/255; 174/73.1; 361/742; 361/804; 361/809

(58) Field of Classification Search
USPC ......... 174/255–258, 73.1, 75 R, 79; 361/742, 361/758, 770, 804, 807–810
See application file for complete search history.

(56) References Cited

U.S. PATENT DOCUMENTS

| | | | |
|---|---|---|---|
| 5,719,752 A * | 2/1998 | Mori et al. ..................... | 361/807 |
| 5,831,330 A | 11/1998 | Chang | |
| 6,046,410 A * | 4/2000 | Wojnarowski et al. ....... | 174/262 |
| 6,049,124 A | 4/2000 | Raiser et al. | |
| 6,492,247 B1 | 12/2002 | Guthrie et al. | |
| 6,493,229 B2 | 12/2002 | Akram et al. | |
| 7,015,570 B2 | 3/2006 | Emma et al. | |
| 7,189,593 B2 | 3/2007 | Lee | |
| 7,218,005 B2 | 5/2007 | Tago | |
| 7,239,020 B2 | 7/2007 | Morkner | |
| 7,242,082 B2 | 7/2007 | Eide | |

(Continued)

FOREIGN PATENT DOCUMENTS

| | | |
|---|---|---|
| CN | 102315183 A | 1/2012 |
| TW | 201025544 | 7/2010 |

(Continued)

OTHER PUBLICATIONS

R. Iyer and L Kleinrock, "Qos Control for Sensor Networks," IEEE International Conference on Communications(ICC), May 11-15, 2003, pp. 517-521.

(Continued)

*Primary Examiner* — Hoa C Nguyen
(74) *Attorney, Agent, or Firm* — Jianq Chyun IP Office

(57) ABSTRACT

A stress relief structure is provided. The stress relief structure includes a stress relief body, at least one first stress relief base and at least one second stress relief base. The stress relief body has an upper surface and a lower surface opposite to each other. The first stress relief base is disposed on the upper surface of the stress relief body. The second stress relief base is disposed on the lower surface of the stress relief body. The at least one first stress relief base and the at least one second stress relief base are interlaced to each other.

17 Claims, 6 Drawing Sheets

(56) References Cited

U.S. PATENT DOCUMENTS

| | | |
|---|---|---|
| 7,345,361 B2 | 3/2008 | Mallik et al. |
| 7,355,273 B2 | 4/2008 | Jackson et al. |
| 7,763,965 B2 | 7/2010 | Webb |
| 7,838,967 B2 | 11/2010 | Chen |
| 8,154,119 B2 | 4/2012 | Yoon et al. |
| 8,241,963 B2 | 8/2012 | Shen et al. |
| 2002/0024115 A1 | 2/2002 | Ibnabdeljalil et al. |
| 2002/0043721 A1 | 4/2002 | Weber |
| 2003/0100143 A1 | 5/2003 | Mulligan et al. |
| 2004/0129938 A1 | 7/2004 | Landers et al. |
| 2005/0042816 A1 | 2/2005 | Watanabe et al. |
| 2006/0202322 A1 | 9/2006 | Kariya et al. |
| 2006/0220250 A1 | 10/2006 | Kim et al. |
| 2006/0278957 A1 | 12/2006 | Lin et al. |
| 2007/0029641 A1 | 2/2007 | Hamatani et al. |
| 2007/0069336 A1 | 3/2007 | Ning |
| 2007/0145567 A1 | 6/2007 | Ning |
| 2008/0067690 A1 | 3/2008 | Kumagai |
| 2008/0083959 A1 | 4/2008 | Wu et al. |
| 2009/0115024 A1 | 5/2009 | Jeng et al. |
| 2010/0195292 A1* | 8/2010 | Ide et al. ............ 361/748 |
| 2010/0284143 A1* | 11/2010 | Lev et al. ........... 361/679.55 |
| 2010/0294552 A1* | 11/2010 | Kobayashi et al. ..... 174/260 |
| 2011/0267791 A1* | 11/2011 | Tomisaka et al. ...... 361/783 |
| 2011/0278732 A1 | 11/2011 | Yu et al. |
| 2011/0303441 A1* | 12/2011 | Kobayashi et al. ..... 174/255 |
| 2011/0303443 A1* | 12/2011 | Kitajima et al. ....... 174/257 |
| 2012/0088409 A1* | 4/2012 | Freedman ............ 439/626 |
| 2013/0343015 A1* | 12/2013 | Malek et al. .......... 361/752 |

FOREIGN PATENT DOCUMENTS

| | | |
|---|---|---|
| TW | 201117341 | 5/2011 |
| TW | 201121375 | 6/2011 |
| TW | 201209982 | 3/2012 |
| TW | 201223897 | 6/2012 |

OTHER PUBLICATIONS

Z. Li et al, "Efficient Thermal-Oriented 3D Floorplanning and Thermal Via Planning for Two-Stacked-Die Integration," ACM Transactions on Design Automation of Electronic Systems, vol. 11, No. 2, Apr. 2006, pp. 325-345.

X. Liu et al., "Failure Mechanisms and Optimum Design for Electroplated Copper Through-Silicon Vias (TSV)," 59th Electronic Components and Technology Conference, May 26-29, 2009, pp. 624-629.

K. H. Lu et al., "Thermal Stress Induced Delamination of Through Silicon Vias in 3-D Interconnects," 60th Electronic Components and Technology Conference (ECTC), Jun. 1-4, 2010, pp. 40-45.

K. H. Lu et al., "Thermo-Mechanical Reliability of 3-D ICs containing Through Silicon Vias," 59th Electronic Components and Technology Conference, May 26-29, 2009, pp. 630-634.

Kim et al., "Application of Through Mold Via (TMV) as PoP Base Package," 58th Electronic Components and Technology Conference, May 27-30, 2008, pp. 1089-1092.

Scanlan, "Package-on-package (PoP) with Through-mold Vias," Advanced Packaging, Jan./Feb. 2008, pp. 40.

Zhang et al., "Development of Through Silicon Via (TSV) Interposer Technology for Large Die (21 × 21 mm) Fine-pitch Cu/low-k FCBGA Package," Proceedings of 59th Electronic Components and Technology Conference, May 2009, pp. 305-312.

Yu et al., "Three Dimensional Interconnects with High Aspect Ratio TSVs and Fine Pitch Solder Microbumps," Proceedings of 59th Electronic Components and Technology Conference, May 2009, pp. 350-354.

Selvanayagam et al., "Nonlinear Thermal Stress/Strain Analyses of Copper Filled TSV (Through Silicon Via) and their Flip-Chip Microbumps," 58th Electronic Components and Technology Conference, May 27-30, 2008, pp. 1073-1081.

Yu et al., "Fabrication of Silicon Carriers with TSV Electrical Interconnections and Embedded Thermal Solutions for High Power 3-D Package," 58th Electronic Components and Technology Conference, May 27-30, 2008, pp. 24-28.

* cited by examiner

STRESS RELIEF STRUCTURE

CROSS-REFERENCE TO RELATED APPLICATION

This application claims the priority benefit of Taiwan application serial no. 101145178, filed on Nov. 30, 2012. The entirety of the above-mentioned patent application is hereby incorporated by reference herein and made a part of this specification.

TECHNICAL FIELD

The technical field relates to a stress relief structure.

BACKGROUND

In recent years, 3D stacking technology has been developing to shorten the length of the leads between the chips, to reduce the dimension of the devices, and to establish a 3D stacked structure of the chips in the semiconductor industry, wherein through-substrate vias are important components in 3D stacking technology for connecting chips stacked vertically.

In the application of the through-substrate vias, in addition to through-silicon vias (TSVs), through-glass vias (TGVs) are also currently available. However, due to coefficient of thermal expansion (CTE) mismatch between the filling material in the through-glass vias and glass and the glass substrate being more brittle and less elastic, uneven thermal stress is generated around the through-glass vias, causing peeling and pop-up in the through-glass vias, and even causing chip cracks.

In the known method for reducing stress, changing the material and the appearance of the through-glass vias, or adding other materials to the structure are usually adopted.

SUMMARY

The disclosure provides a stress relief structure.

One exemplary embodiment provides a stress relief structure including a stress relief body, at least one first stress relief base and at least one second stress relief base. The stress relief body has an upper surface and a lower surface opposite to each other. The first stress relief base is disposed on the upper surface of the stress relief body. The second stress relief base is disposed on the lower surface of the stress relief body. The at least one first stress relief base and the at least one second stress relief base are interlaced to each other.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of the specification. The drawings illustrate embodiments of the disclosure and, together with the description, serve to explain the principles of the disclosure.

DETAILED DESCRIPTION OF DISCLOSED EMBODIMENTS

Figure 1A:
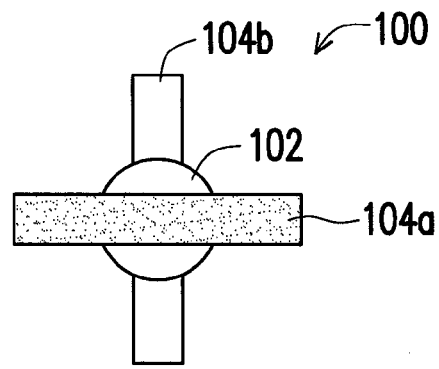
FIG. 1A is a schematic top view of a stress relief structure according to an embodiment of the disclosure.
Figure 1B:
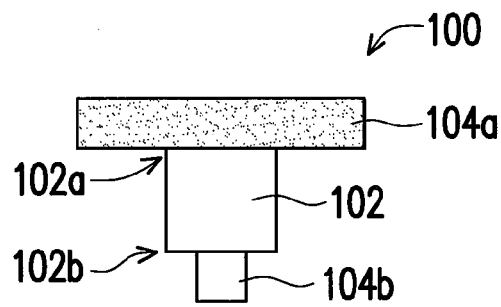
FIG. 1B is a schematic cross-sectional diagram of a stress relief structure according to an embodiment of the disclosure.
Figure 2:
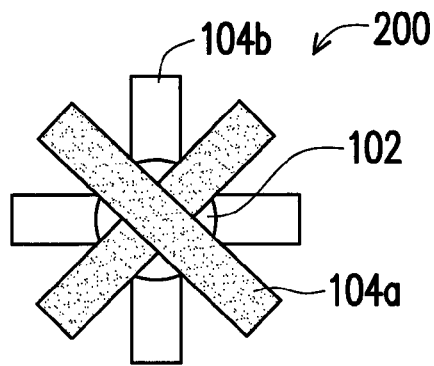
FIG. 2 is a schematic top view of a stress relief structure according to another embodiment of the disclosure.

FIG. 1A is a schematic top view of a stress relief structure according to an embodiment of the disclosure. FIG. 1B is a schematic cross-sectional diagram of a stress relief structure according to an embodiment of the disclosure. FIG. 2 is a schematic top view of a stress, relief structure according to another embodiment of the disclosure.

Referring simultaneously to FIG. 1A, FIG. 1B, and FIG. 2, a stress relief structure 100 and a stress relief structure 200 include a stress relief body 102, at least one stress relief base 104a, and at least one stress relief base 104b.

The stress relief body 102 has an upper surface 102a and a lower surface 102b opposite to each other. A material of the stress relief body 102 is, for instance, an elastic material or a brittle material. In an embodiment, the material of the stress relief body 102 is, for instance, a metal, a polymer, or a carbon-based material, wherein the metal is, for instance, copper-tungsten, iron, or an alloy thereof; the polymer is, for instance, polyacetylene; and the carbon-based material is, for instance, an activated carbon, carbon fibers, or carbon nanotubes. A shape of the stress relief body 102 is, for instance, a circle, a polygon, or a shape having a geometric center. In FIG. 1A, FIG. 1B, and FIG. 2, although the shape of the stress relief body 102 is illustrated as circular, the disclosure is not limited thereto.

The stress relief base 104a is disposed on the upper surface 102a of the stress relief body 102. A material of the stress relief base 104a is, for instance, a metal, a polymer, or a carbon-based material, wherein the metal is, for instance, copper-tungsten, iron, or an alloy thereof; the polymer is, for instance, polyacetylene; and the carbon-based material is, for instance, an activated carbon, carbon fibers, or carbon nanotubes. A shape of the stress relief base 104a is, for instance, a rectangle, a circle, or a pointed shape. In FIG. 1A, FIG. 1B, and FIG. 2, although the shape of the stress relief base 104a is illustrated as rectangular, the disclosure is not limited thereto. Moreover, when there is a plurality of the stress relief bases 104a, the stress relief bases 104a are interlaced to each other. Referring to FIG. 2, there are two stress relief bases 104a in the stress relief structure 200, and the stress relief bases 104a are interlaced to each other at 90 degrees. Although the two stress relief bases 104a are illustrated in FIG. 2, and the two stress relief bases 104a are interlaced to each other at 90 degrees, the disclosure is not limited thereto. In other embodiments, the number of the stress relief bases 104a may be greater than three, and the stress relief bases 104a are interlaced to each other.

The stress relief base 104b is disposed on the lower surface 102b of the stress relief body 102. A material of the stress relief base 104b is, for instance, a metal, a polymer, or a carbon-based material, wherein the metal is, for instance, copper-tungsten, iron, or an alloy thereof; the polymer is, for instance, polyacetylene; and the carbon-based material is, for instance, an activated carbon, carbon fibers, or carbon nanotubes. A shape of the stress relief base 104b is, for instance, a rectangle, a circle, or a pointed shape. In FIG. 1A, FIG. 1B, and FIG. 2, although the shape of the stress relief base 104b is illustrated as rectangular, the disclosure is not limited thereto. Moreover, in FIG. 1A, FIG. 1B, and FIG. 2, although the shapes of the stress relief base 104a and the stress relief base 104b are illustrated as rectangular, the disclosure is not limited thereto. The shapes of the stress relief base 104a and the stress relief base 104b may be the same or different. Moreover, when there is a plurality of the stress relief bases 104b, the stress relief bases 104b are interlaced to each other. Referring to FIG. 2, there are two stress relief bases 104b in the stress relief structure 200, and the two stress relief bases 104b are interlaced to each other at 90 degrees. Although the two stress relief bases 104b are illustrated in FIG. 2, and the two stress relief bases 104b are interlaced to each other at 90 degrees, the disclosure is not limited thereto. In other embodiments, the number of the stress relief bases 104b may be more than three, and the stress relief bases 104b are interlaced to each other.

Referring to FIG. 1A and FIG. 1B, the at least one stress relief base 104a and the at least one stress relief base 104b are, for instance, interlaced to each other. In the embodiment, the number of each of the stress relief base 104a and the stress relief base 104b is one, and both of which are, for instance, interlaced to each other at 90 degrees. Although the stress relief base 104a and the stress relief base 104b are illustrated as being interlaced to each other at 90 degrees in FIG. 1A and FIG. 1B, the disclosure is not limited thereto. In other embodiments, an angle between the stress relief base 104a and the stress relief base 104b interlaced to each other may be other angles less than 180 degrees.

Figure 3:
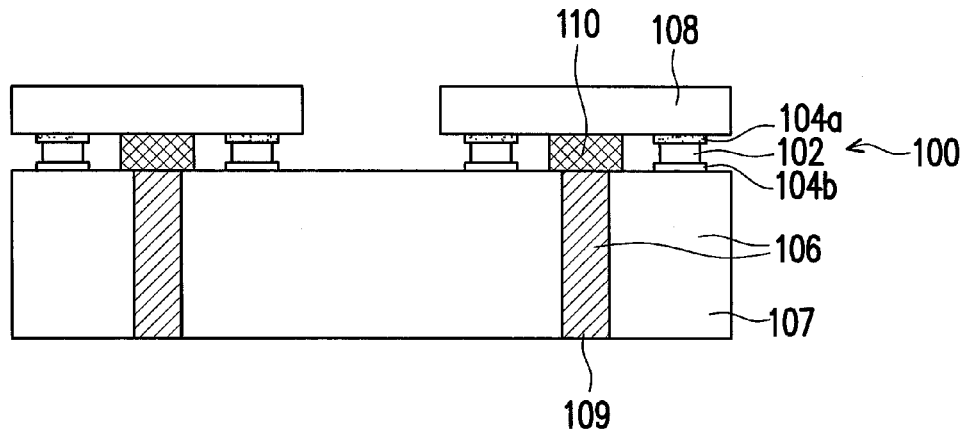
FIG. 3 is a schematic cross-sectional diagram of a structure containing a stress relief structure of the disclosure according to an embodiment of the disclosure.

Moreover, the stress relief structure 100 and the stress relief structure 200 may be applied to a 3D-integrated circuit (3D-IC) structure having a glass interposer as illustrated in FIG. 3.

FIG. 3 is a schematic cross-sectional diagram of a 3D-IC structure containing a stress relief structure according to an embodiment of the disclosure.

Referring to FIG. 3, the 3D-IC structure includes the stress relief structure 100, an interposer 106, a die 108, and a bump 110.

The stress relief structure 100 is disposed between the interposer 106 and the die 108, the at least one stress relief base 104a is disposed between the stress relief body 102 and the die 108, and the at least one stress relief base 104b is disposed between the stress relief body 102 and the interposer 106.

The interposer 106 includes a glass substrate 107 and at least one through-glass via 109. The at least one through-glass via 109 is disposed in the glass substrate 107. A material of the through-glass vias 109 is, for instance, copper-tungsten, iron, or an alloy thereof.

The bump 110 is disposed between the interposer 106 and the die 108 to electrically connect the interposer 106 and the die 108. A material of the bump 110 is, for instance, copper-tungsten, iron, or an alloy thereof.

Moreover, the coefficient of thermal expansion of the stress relief body 102 is, for instance, 80% to 120% of the coefficient of thermal expansion of the through-glass vias 109. In other words, when the material of through-glass vias 109 is copper, the stress relief body 102 may be a metal or a polymer material having a coefficient of thermal expansion of, for instance, 6 ppm/° C. to 21 ppm/° C. The coefficients of thermal expansion of the stress relief base 104a and the stress relief base 104b are, for instance, 80% to 120% of the coefficient of thermal expansion of the through-glass vias 109.

In the 3D-IC structure, the stress relief body 102 may be used as an absorber for crack energy, and the absorbed energy in the stress relief body 102 may be dissipated by the stress relief base 104a and the stress relief base 104b into the interposer 106, which may in principle achieve a goal of reducing thermal stress.

It should be mentioned that, the stress relief structure 100 of the embodiment used to absorb energy is disposed using the following layout: when the at least one through-glass via 109 comprises a plurality of through-glass vias 109, at least one of the stress relief structures 100 may be disposed in a circle 202 with a circle center as a geometric center P of a polygon 300 composed of the through-glass vias 109 as vertices, wherein the circle 202 is located in the polygon 300, and a radius Cr of the circle 202 is less than twice a radius R of the through-glass vias 109. Moreover, in the above-described layout, when the shape of the stress relief body 102 is circular and the shapes of the at least one stress relief base 104a and the at least one stress relief base 104b are rectangular, the relationships among the radius R of the through-glass vias 109, the radius r of the stress relief body 102, a distance L between the center of the at least one through-glass via 109 and the center of the stress relief body 102, a short-side length $W_1$ of the at least one stress relief base 104a and a short-side length $W_2$ of the at least one stress relief base 104b are defined by the following Formula 1 to Formula 3, but the disclosure is not limited thereto.

$$0.2R \leq r \qquad \qquad \text{Formula 1}$$

$$0 \leq L \leq 4(R+r) \qquad \qquad \text{Formula 2}$$

$$0 \leq W_1, W_2 \leq 8r \qquad \qquad \text{Formula 3}$$

Hereinafter, FIG. 4 to FIG. 6C are used to explain the layout with the stress relief body 102 being circular and the stress relief base 104a and the stress relief base 104b being rectangular. The stress relief structure 100 of FIG. 1A and FIG. 1B is taken as an example in FIG. 4 to FIG. 6C for illustration purposes, but the disclosure is not limited thereto. In other embodiments, the stress relief structure 200 of FIG. 2 or other stress relief structures having different numbers of the stress relief bases may also be used.

Figure 4:
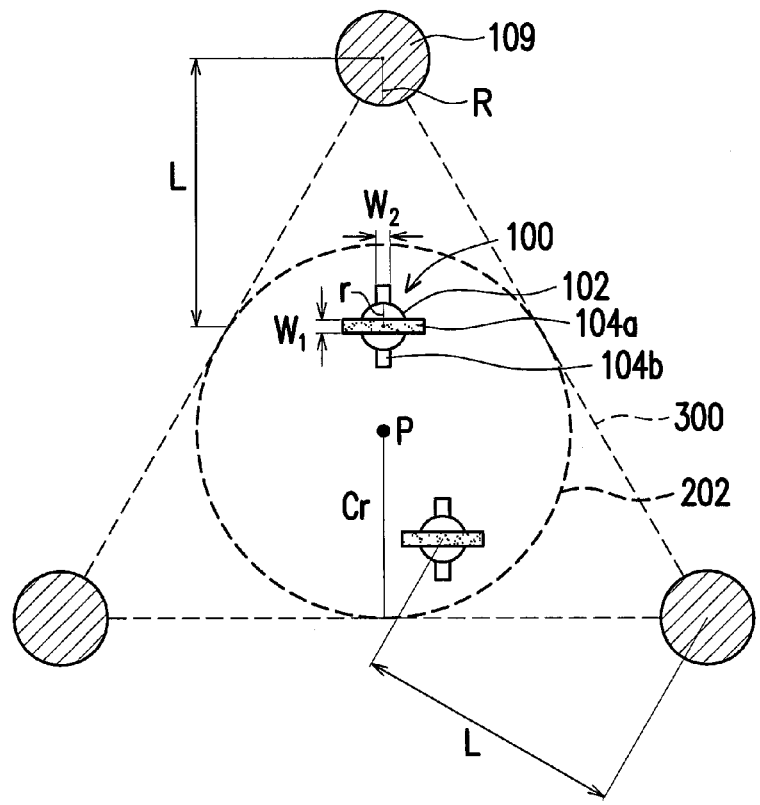
FIG. 4 is a schematic diagram of a layout of three through-glass vias according to an embodiment of the disclosure.

FIG. 4 is a schematic diagram of a layout of three through-glass vias according to an embodiment of the disclosure.

Referring to FIG. 4, for illustration purposes, the number of the through-glass vias 109 is three, and the polygon 300 composed of the through-glass vias 109 as vertices is an equilateral triangle (illustrated by dash lines) in the embodiment, for example, but the disclosure is not limited thereto. In other embodiments, the number of the through-glass vias 109 may be greater than three, and the polygon composed of the through-glass vias 109 as vertices may be a regular polygon or an arbitrary polygon. Two stress relief structures 100 are disposed in the circle 202 located in the polygon 300 and having the circle center as the geometric center P of the polygon 300. In the embodiment, although two stress relief structures 100 are illustrated as being disposed in the circle 202, the disclosure is not limited thereto. In other embodiments, the number of the stress relief structure 100 is not limited by the present disclosure, as long as at least one stress relief structure 100 is disposed in the circle 202.

In the embodiment, the radius Cr of the circle 202 is twice the radius R of the through-glass vias 109, the radius r of the stress relief body 102 is half the radius R of the through-glass vias 109, the distance L between the center of the through-glass vias 109 and the center of the stress relief body 102 is four times less than the sum of the radius r of the stress relief body 102 and the radius R of the through-glass vias 109, and the short-side length $W_1$ of the stress relief base 104a and the short-side length $W_2$ of the stress relief base 104b are eight times less than the radius r of the stress relief body 102, but the disclosure is not limited thereto. In other embodiments, the number of the through-glass vias 109, the type of the polygon composed thereby, and the number of the stress relief structure 100 disposed may be adjusted according to different actual needs. The dimensional relationships among the radius Cr, the radius R, the radius r, the distance L, the short-side length $W_1$, and short-side length $W_2$ may also be adjusted according to different actual needs, as long as the dimensional relationships fall within the scope of the definition described above.

It should be mentioned that, in the layout of the embodiment, the polygon 300 composed of the through-glass vias 109 as vertices is not limited to the polygon 300 composed of all the through-glass vias 109 as vertices. Different polygons 300 may be composed of any three or more through-glass vias 109 selected from all the through-glass vias 109 as vertices.

Hereinafter, FIG. 5A to FIG. 5D and FIG. 6A to FIG. 6C are used to explain a polygon composed of more than three through-glass vias, and the other conditions and the size definitions of the layout provided are not specified otherwise. However, it should be understood that FIG. 5A to FIG. 5D and FIG. 6A to FIG. 6C are similar to the layout and the size definitions provided above.

FIG. 5A to FIG. 5D are schematic diagrams of layouts of four through-glass vias according to an embodiment of the disclosure. FIG. 6A to FIG. 6C are schematic diagrams of layouts of five through-glass vias according to an embodiment of the disclosure.

Figure 5A:
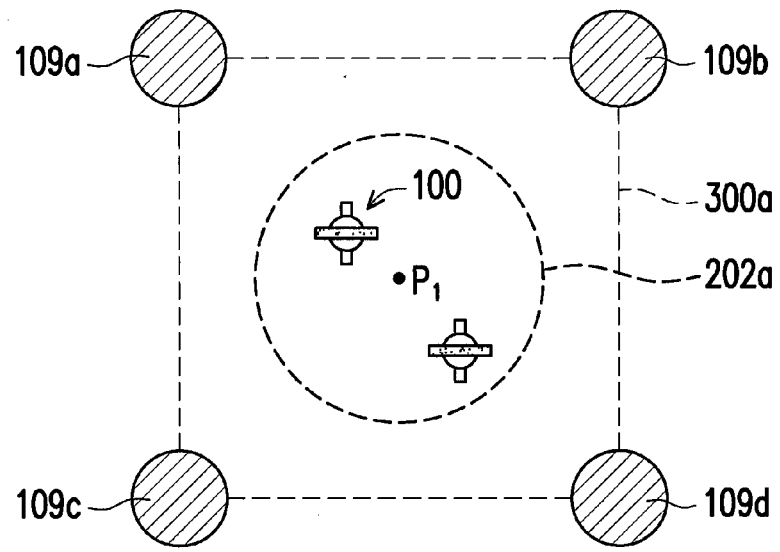
FIG. 5A to FIG. 5D are schematic diagrams of layouts of four through-glass vias according to an embodiment of the disclosure.
Figure 6A:
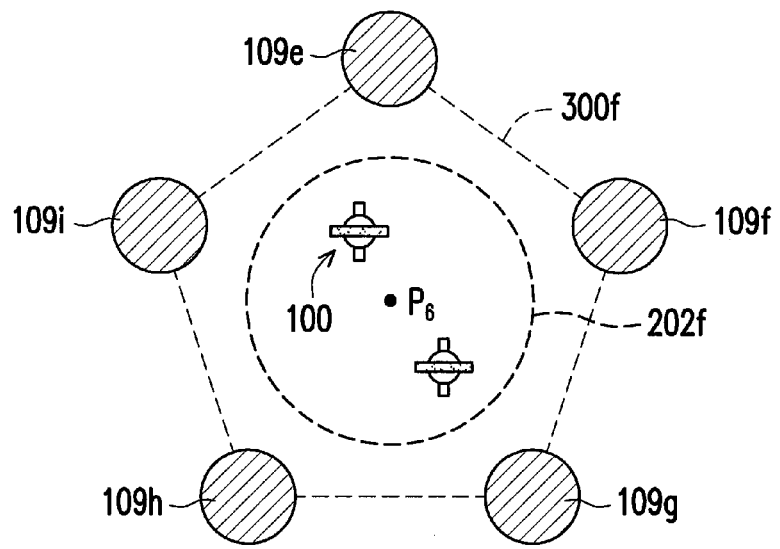
FIG. 6A to FIG. 6C are schematic diagrams of layouts of five through-glass vias according to an embodiment of the disclosure.
Figure 6B:
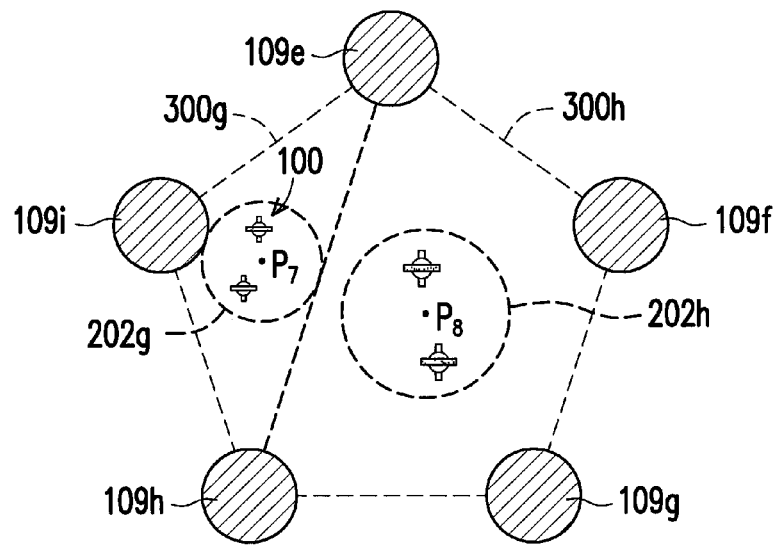
Figure 6C:
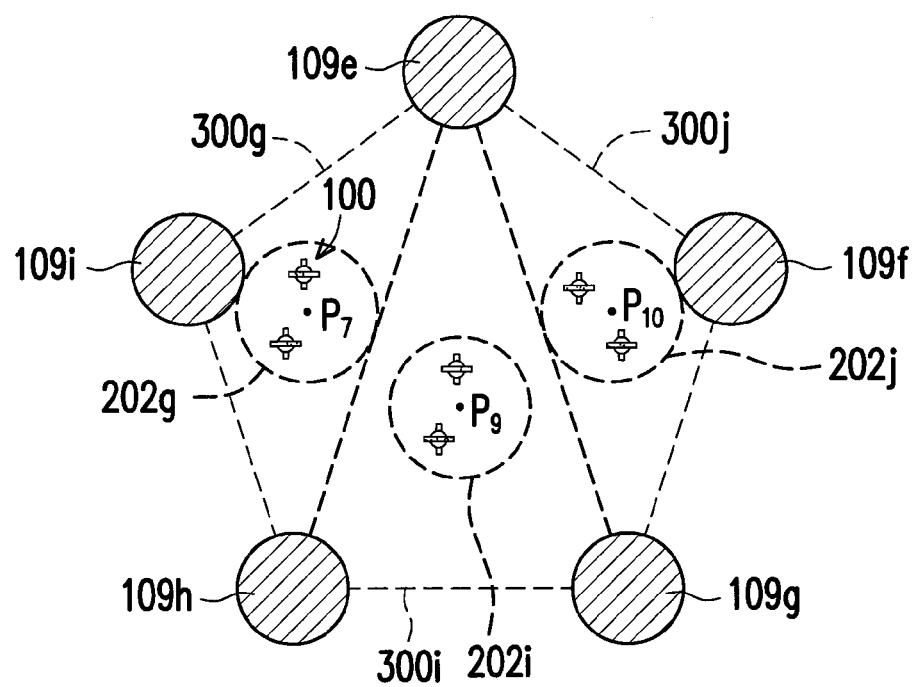

Referring to FIG. 5A, a polygon composed of through-glass vias 109a, 109b, 109c, and 109d as vertices includes a tetragon 300a composed of the through-glass vias 109a, 109b, 109c, and 109d as vertices. Moreover, the circle center of a circle 202a in the tetragon 300a is a geometric center $P_1$ of the tetragon 300a. Moreover, at least one stress relief structure 100 may be disposed in the circle 202a according to the layout and the size definitions provided above (as illustrated in FIG. 4).

Figure 5B:
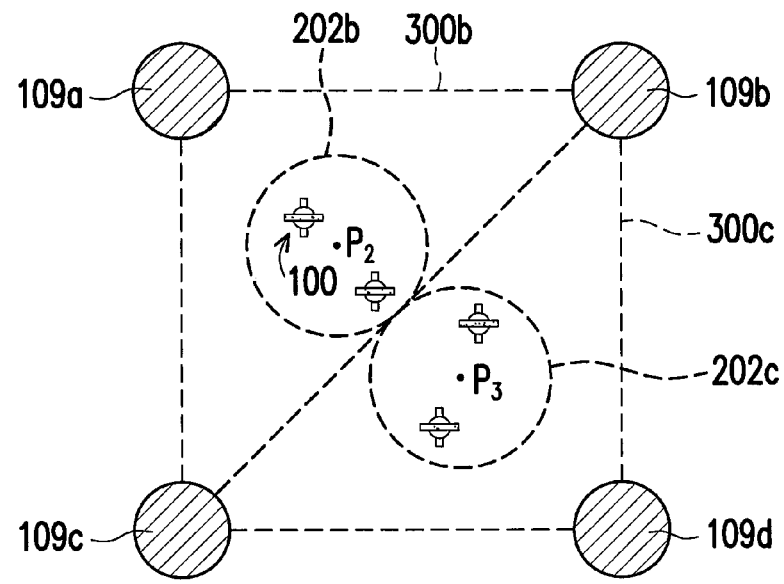

Referring to FIG. 5B, a polygon composed of the through-glass vias 109a, 109b, 109c, and 109d as vertices includes a triangle 300b and a triangle 300c. The triangle 300b is composed of the through-glass vias 109a, 109b, and 109c as vertices. The triangle 300c is composed of the through-glass vias 109b, 109c, and 109d as vertices. In particular, the circle center of a circle 202b in the triangle 300b is a geometric center $P_2$ of the triangle 300b, and the circle center of a circle 202c in the triangle 300c is a geometric center $P_3$ of the triangle 300c. Similarly, at least one stress relief structure 100 may be respectively disposed in the circle 202b and the circle 202c according to the layout and the size definitions provided above (as illustrated in FIG. 4).

Figure 5C:
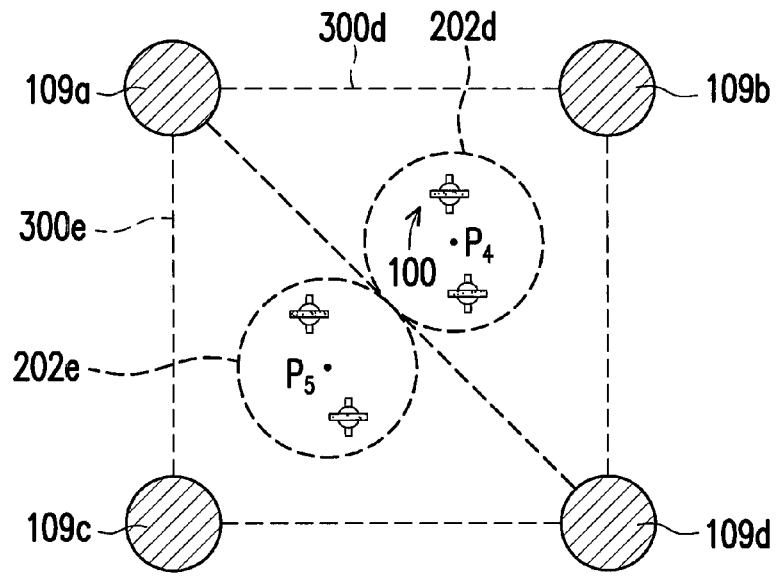

Referring to FIG. 5C, a polygon composed of the through-glass vias 109a, 109b, 109c, and 109d as vertices includes a triangle 300d and a triangle 300e. The triangle 300d is composed of the through-glass vias 109a, 109b, and 109d as vertices. The triangle 300e is composed of the through-glass vias 109a, 109c, and 109d as vertices. In particular, the circle center of a circle 202d in the triangle 300d is a geometric center $P_4$ of the triangle 300d, and the circle center of a circle 202e in the triangle 300e is a geometric center $P_5$ of the triangle 300e. Similarly, at least one stress relief structure 100 may be respectively disposed in the circle 202d and the circle 202e according to the layout and the size definitions provided above (as illustrated in FIG. 4).

Figure 5D:
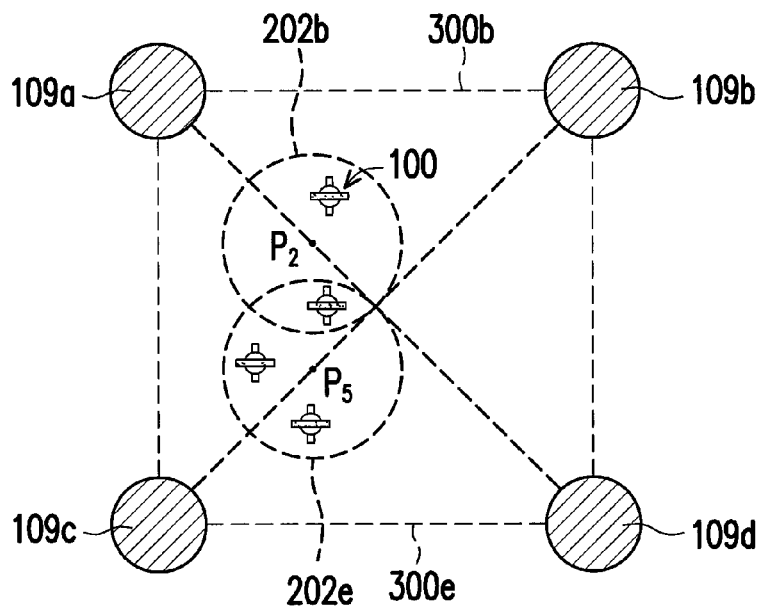

Referring to FIG. 5D, a polygon composed of the through-glass vias 109a, 109b, 109c, and 109d as vertices includes the triangle 300b and the triangle 300e. The triangle 300b is composed of the through-glass vias 109a, 109b, and 109c as vertices. The triangle 300e is composed of the through-glass vias 109a, 109c, and 109d as vertices. In particular, the circle center of the circle 202b in the triangle 300b is the geometric center $P_2$ of the triangle 300b, and the circle center of the circle 202e in the triangle 300e is the geometric center $P_5$ of the triangle 300e. Similarly, at least one stress relief structure 100 may be respectively disposed in the circle 202b and the circle 202e according to the layout and the size definitions provided above (as illustrated in FIG. 4).

Based on the above, it may be acquired from FIG. 5A and FIG. 5B to FIG. 5D that, when there are four through-glass vias (e.g. the through-glass vias 109a, 109b, 109c, and 109d), a tetragon may be composed from the four through-glass vias as vertices or a triangle may be composed from any three through-glass vias among those as vertices. Moreover, it is acquired from FIG. 5B to FIG. 5D that, triangles (e.g. the triangles 300b, 300c, 300d, and 300e) composed of any three through-glass vias as vertices may be used in combination according to different actual needs and the selectivity of the application. Moreover, referring simultaneously to FIG. 5A to FIG. 5D, the tetragon 300a composed of four through-glass vias as vertices and the triangles 300b, 300c, 300d, and 300e composed of any three through-glass vias as vertices may be used in combination according to different actual needs and the selectivity of the application to define circles (e.g. the circles 202a, 202b, 202c, 202d, and 202e) in the polygons, thereby determining the range of installation of the stress relief structure 100.

Then, referring to FIG. 6A, a polygon composed of through-glass vias 109e, 109f, 109g, 109h, and 109i as vertices includes a pentagon 300f composed of the through-glass vias 109e, 109f, 109g, 109h, and 109i as vertices. Moreover, the circle center of a circle 202f in the pentagon 300f is a geometric center $P_6$ of the pentagon 300f. Moreover, at least one stress relief structure 100 may be disposed in the circle 202f according to the layout and the size definitions provided above (as illustrated in FIG. 4).

Referring to FIG. 6B, a polygon composed of the through-glass vias 109e, 109f, 109g, 109h, and 109i as vertices includes a triangle 300g and a tetragon 300h. The triangle 300g is composed of the through-glass vias 109e, 109h, and 109i as vertices. The tetragon 300h is composed of the through-glass vias 109e, 109f, 109g, and 109h as vertices. In particular, the circle center of a circle 202g in the triangle 300g is a geometric center $P_7$ of the triangle 300g, and the circle center of a circle 202h in the tetragon 300h is a geometric center $P_8$ of the tetragon 300h. Similarly, at least one stress relief structure 100 may be respectively disposed in the circle 202g and the circle 202h according to the layout and the size definitions provided above (as illustrated in FIG. 4).

Referring to FIG. 6C, a polygon composed of the through-glass vias 109e, 109f, 109g, 109h, and 109i as vertices includes the triangle 300g, a triangle 300i, and a triangle 300j. The triangle 300g is composed of the through-glass vias 109e, 109h, and 109i as vertices. The triangle 300i is composed of the through-glass vias 109e, 109h, and 109g as vertices. The triangle 300j is composed of the vertices of the through-glass vias 109e, 109g, and 109f. In particular, the circle center of the circle 202g in the triangle 300g is the geometric center $P_7$ of the triangle 300g, the circle center of a circle 202i in the triangle 300i is a geometric center $P_9$ of the triangle 300i, and the circle center of a circle 202j in the triangle 300j is a geometric center $P_{10}$ of the triangle 300j. Similarly, at least one stress relief structure 100 may respectively be disposed in the circle 202g, the circle 202i, and the circle 202j according to the layout and the size definitions provided above (as illustrated in FIG. 4).

Based on the above, it may be acquired from FIG. 6A and FIG. 6B that, when there are five through-glass vias (e.g. the through-glass vias 109e, 109f, 109g, 109h, and 109i), a pentagon may be composed from the five through-glass vias as vertices, a tetragon may be composed from any four through-glass vias among those as vertices, or a triangle may be composed from any three through-glass vias among those as vertices. Moreover, in FIG. 6B and FIG. 6C, although the triangles 300g, 300i, 300j and the tetragon 300h are illustrated, the disclosure is not limited thereto. It should be noted that, a triangle or a tetragon composed of any three or four of the through-glass vias 109e, 109f, 109g, 109h, and 109i may be used for the polygon 300 in the layout of the embodiment, and at least one stress relief structure 100 may also be disposed in the circle with the circle center as the geometric center of the triangle or the tetragon. Moreover, a pentagon composed of five through-glass vias as vertices, a triangle composed of any three through-glass vias as vertices, or a tetragon composed of any four through-glass vias as vertices may be used in combination according to different actual needs and the selectivity of the application to define the circle in any of the polygons, thereby determining the range of installation of the stress relief structure 100.

It may be acquired from the above-described embodiment that, damage to the die may be reduced by directly applying a stress relief structure 100 to the current 3D-IC structure and using a specific layout to effectively absorb energy.

The following uses an experimental example to simulate an effect of a stress relief structure provided in the above-described embodiment on a maximum energy release rate.

TABLE 1

| Number of Stress Relief Structures | Maximum Energy Release Rate (MPa) | Reduction Ratio of the Maximum Energy Release Rate (%) |
|---|---|---|
| 0 | 288 | 0 |
| 2 | 184 | 36.11% |
| 4 | 166 | 42.36% |

Referring to Table 1, when the stress relief structure is not used, the maximum energy release rate is 288 MPa. When two stress relief structures are used, the maximum energy release rate is reduced to 184 MPa, and the reduction ratio is 36.11%. When four stress relief structures are used, the maximum energy release rate is reduced to 166 MPa, and the reduction ratio is 42.36%. It may be acquired that the stress relief structure provided in the above-described embodiment does absorb energy, and that the more stress relief structures are used, the more energy is absorbed.

In summary, the stress relief structure provided in the above-described embodiment may be directly applied to the current fabrication process of 3D-ICs by a specific layout.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:

1. A stress relief structure, comprising:
a stress relief body, having an upper surface and a lower surface opposite to each other;
at least one first stress relief base, disposed on the upper surface of the stress relief body; and
at least one second stress relief base, disposed on the lower surface of the stress relief body,
wherein the at least one first stress relief base and the at least one second stress relief base are interlaced to each other.

2. The stress relief structure of claim 1, wherein when the at least one first stress relief base comprises a plurality of first stress relief bases, the first stress relief bases are interlaced to each other.

3. The stress relief structure of claim 1, wherein when the at least one second stress relief base comprises a plurality of second stress relief bases, the second stress relief bases are interlaced to each other.

4. The stress relief structure of claim 1, wherein the stress relief structure is disposed between an interposer and a die; the at least one first stress relief base is disposed between the stress relief body and the die; and the at least one second stress relief base is disposed between the stress relief body and the interposer.

5. The stress relief structure of claim 4, wherein the interposer comprises:
a glass substrate; and
at least one through-glass via, disposed in the glass substrate.

6. The stress relief structure of claim 5, wherein a coefficient of thermal expansion of the stress relief body is 80% to 120% of a coefficient of thermal expansion of the at least one through-glass via.

7. The stress relief structure of claim 5, wherein coefficients of thermal expansion of the at least one first stress relief base and the at least one second stress relief base are 80% to 120% of a coefficient of thermal expansion of the at least one through-glass via.

8. The stress relief structure of claim 5, wherein when the at least one through-glass via comprises a plurality of through-glass vias, at least one of stress relief structures is disposed in a circle with a circle center as a geometric center of a polygon composed of the through-glass vias as vertices, wherein the circle is inside the polygon.

9. The stress relief structure of claim 8, wherein a radius of the circle is less than twice a radius of the at least one through-glass via.

10. The stress relief structure of claim 5, wherein relationships among a radius R of the at least one through-glass via, a radius r of the stress relief body, a distance L between a center of the at least one through-glass via and a center of the stress relief body, a short-side length $W_1$ of the at least one first stress relief base and a short-side length $W_2$ of the at least one second stress relief base are defined by the following Formula 1 to Formula 3:

$$0.2R \leq r \qquad \text{Formula 1}$$

$$0 \leq L \leq 4(R+r) \qquad \text{Formula 2}$$

$$0 \leq W_1, W_2 \leq 8r \qquad \text{Formula 3.}$$

11. The stress relief structure of claim 1, wherein a material of each of the stress relief body, the at least one first stress relief base and the at least one second stress relief base comprises an elastic material or a brittle material.

12. The stress relief structure of claim 1, wherein a material of each of the stress relief body, the at least one first stress relief base and the at least one second stress relief base comprises a metal, a polymer, or a carbon-based material.

13. The stress relief structure of claim 12, wherein the metal comprises copper-tungsten, iron, or an alloy thereof.

14. The stress relief structure of claim 12, wherein the polymer comprises polyacetylene.

15. The stress relief structure of claim 12, wherein the carbon-based material comprises an activated carbon, carbon fibers, or carbon nanotubes.

16. The stress relief structure of claim 1, wherein a shape of each of the at least one first stress relief base and the at least one second stress relief base respectively comprises a rectangle, a circle, or a pointed shape.

17. The stress relief structure of claim 1, wherein a shape of the stress relief body comprises a circle, a polygon, or a shape having a geometric center.

* * * * *